United States Patent
Hsieh et al.

(10) Patent No.: US 8,487,675 B2
(45) Date of Patent: Jul. 16, 2013

(54) PHASE-LOCKED LOOP

(75) Inventors: Ming-Yu Hsieh, ChuPei (TW); Shih-Chieh Yen, ChuPei (TW)

(73) Assignee: MStar Semiconductor, Inc. (TW)

( * ) Notice: Subject to any disclaimer, the term of this patent is extended or adjusted under 35 U.S.C. 154(b) by 0 days.

(21) Appl. No.: 13/297,195

(22) Filed: Nov. 15, 2011

(65) Prior Publication Data
US 2012/0119801 A1    May 17, 2012

(30) Foreign Application Priority Data
Nov. 16, 2010   (TW) ................................ 99139438 A

(51) Int. Cl.
*H03L 7/06* (2006.01)
(52) U.S. Cl.
USPC .......................................... 327/156; 327/147
(58) Field of Classification Search
USPC ................................................ 327/147, 156
See application file for complete search history.

(56) References Cited

U.S. PATENT DOCUMENTS

| | | | |
|---|---|---|---|
| 6,611,176 B1* | 8/2003 | Goldman | 331/17 |
| 7,176,763 B2* | 2/2007 | Park | 331/17 |
| 7,570,043 B2* | 8/2009 | Goldman | 324/72.5 |
| 7,639,070 B2* | 12/2009 | Goldman | 327/552 |
| 8,223,911 B2* | 7/2012 | Ludwig | 375/376 |
| 2004/0061559 A1* | 4/2004 | Charlon | 331/17 |
| 2005/0237120 A1* | 10/2005 | Park | 331/16 |
| 2007/0109030 A1* | 5/2007 | Park | 327/156 |
| 2012/0200327 A1* | 8/2012 | Sreekiran et al. | 327/157 |

\* cited by examiner

*Primary Examiner* — Adam Houston
(74) *Attorney, Agent, or Firm* — Han IP Law PLLC

(57) ABSTRACT

A phase-locked loop (PLL) including an active filter, a voltage-controlled oscillator (VCO), two phase detectors, a charge pump and a digital-to-analog converter (DAC) is provided. The VCO generates an oscillation signal according to a control signal provided at an output of the active filter. The first phase detector generates a phase difference signal according to a reference signal and a feedback signal associating with the oscillation signal. The charge pump provides a charging current to a first input of the active filter according to the phase difference. The second phase detector generates a digital reference signal according to the phase difference between the reference signal and the feedback signal. The DAC converts the digital reference signal to an analog reference voltage and provides the analog reference voltage to the second input of the active filter.

11 Claims, 7 Drawing Sheets

PHASE-LOCKED LOOP

This application claims the benefit of Taiwan application Serial No. 99139438, filed Nov. 16, 2010, the subject matter of which is incorporated herein by reference.

BACKGROUND OF THE INVENTION

1. Field of the Invention

The invention relates in general to a phase-locked loop (PLL), and more particularly to a circuit structure of a PLL.

2. Description of the Related Art

In current computer systems and communication systems, a PLL providing oscillation signals of accurate frequencies plays a crucial role. Taking a wireless communication system for example, its transmission end often utilizes oscillation signals generated by a PLL as a reference for signal transmission. As a result, the quality of wireless signals is directly influenced by characteristics from a locking speed, a loop bandwidth to surge energy of the PLL.

FIG. 1 shows a structural diagram of a type-I phased-locked loop. A PLL 10 comprises a phase detector 11, a charge pump 12, a filter 13 consisted of a resistor R and a capacitor C, a voltage-controlled oscillator (VCO) 14, and a frequency divider 15. Since the resistor R forms a leakage path between an input and a ground end of the VCO 14, the phase detector 11 is mandated to output cyclic pulses whether the PLL 10 is locked, so that the charge pump 12 charges the input of the VCO 14 to compensate charge lost through the resistor R. When the PLL 10 is stabilized and a balance between charging and discharging is reached, a cycle of the pulses then equals a cycle of reference signals. However, the existence of the cyclic pulses imposes interference on oscillation signals at the output of the VCO 14. As a phase difference between the reference signals and feedback signals grows larger, the pulses become wider and have greater energy. Consider circumstances that the oscillation signals have a frequency of 3.66 GHz, and the reference signals have a frequency of 26 MHz. In a spectrum of the output signals from the VCO 14, apart from a main component occurring at 3.66 GHz, so-called surges at 3.66 GHz±26 MHz are also present. Many wireless communication standards have specifications regarding upper limits of surge energy. A shortcoming of the type-I PLL is that the charging pulses usually result in excessively high surge energy.

FIG. 2 shows a structural diagram of a type-II PLL. A PLL 20 comprises a phase detector 21, two charge pumps 22A and 22B, an active filter 23 consisted of a resistor R, capacitors C1, C2 and C3, and an amplifier 23A, a VCO 24, and a frequency divider 25. As the PLL 20 becomes locked from unlocked, the second charge pump 22B charges/discharges the capacitor C1 in the active filter 23 according to a phase difference detected by the phase detector 21, until a reference voltage $V_{REF}$ indicated in the diagram is gradually pulled up/down to a control voltage appropriate for an input of the VCO 24 when the PLL 20 is locked. Before the PLL 20 becomes locked, the reference voltage $V_{REF}$ and the control voltage usually need to go through a period of damping to be stabilized. This structure is free from the excessively high surge energy occurring in the type-I PLL, but yet a locking speed of the PLL 20 is directly restrained by a charge/discharge speed of the second charge pump 22B with respect to the capacitor C1. Further, the damping process also lengthens the locking speed of the PLL 20.

SUMMARY OF THE INVENTION

The invention is directed to a novel PLL structure, in which a digital charging path is utilized to replace the analog charging path consisted of a second charge pump 22B and a capacitor C2 in the prior art. The digital charging path can be designed to directly provide a predetermined charge amount according to a phase difference, so as to steadily pull up a reference voltage provided to an active filter to prevent damping and effectively reduce time needed for locking the PLL.

According to an aspect of the present invention, a PLL comprising an active filter, a VCO, two phase detectors, a charge pump and a DAC is provided. The VCO generates an oscillation signal according to a control signal provided by an output of the active filter. The first phase detector generates a phase difference signal according to a reference signal and a feedback signal associating with the oscillation signal. The charge pump provides a charging current to a first input of the active filter according to the phase difference signal. The second phase detector generates a digital reference signal according to the phase difference between the reference signal and the feedback signal. The DAC converts the digital reference signal to an analog reference voltage, and provides the analog reference signal to a second input of the active filter.

Compared to the prior art, the present invention contributes advantages of having a fast locking speed and low surge energy. The above and other aspects of the invention will become better understood with regard to the following detailed description of the preferred but non-limiting embodiment(s). The following description is made with reference to the accompanying drawings.

DETAILED DESCRIPTION OF THE INVENTION

Figure 3:
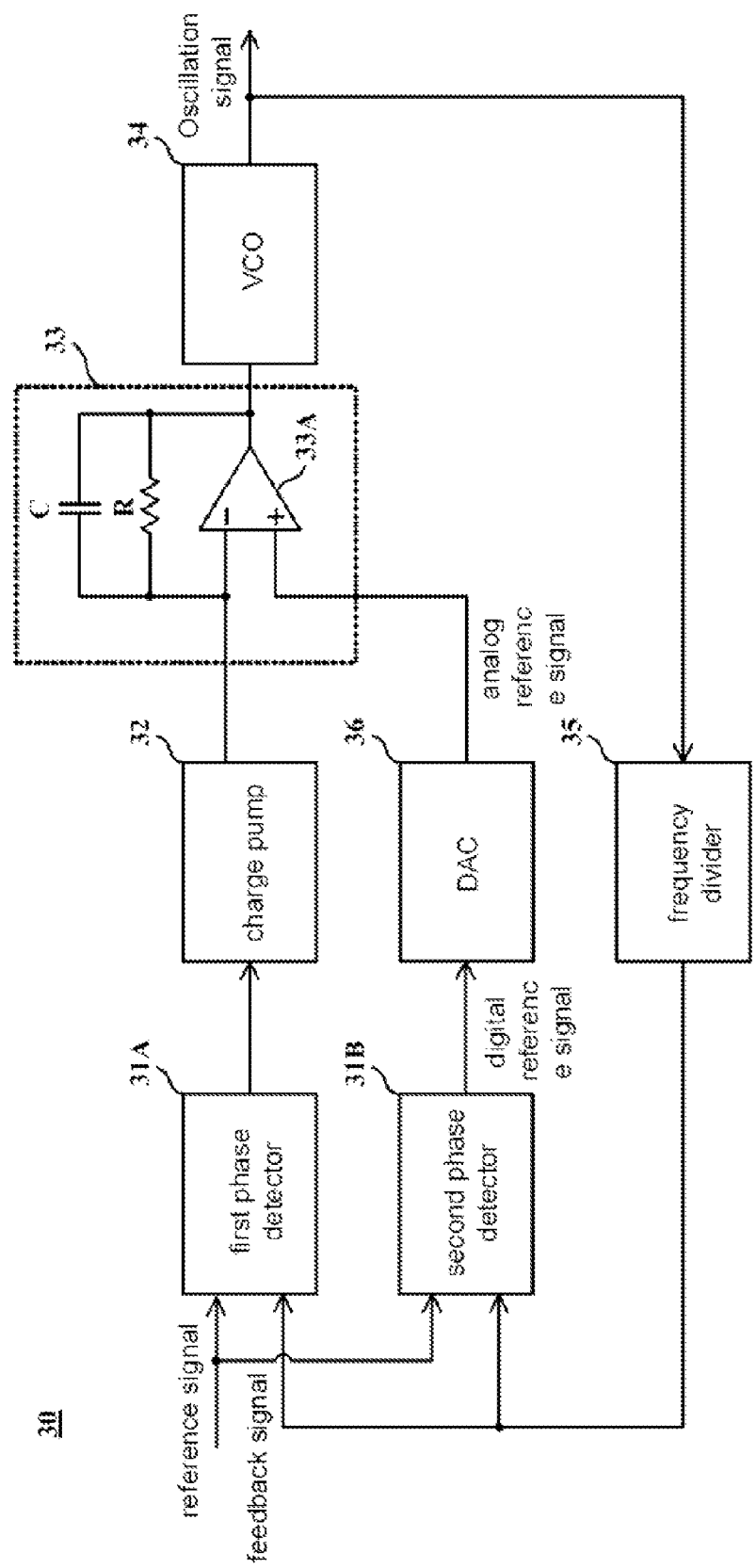
FIG. 3 is a block diagram of a PLL according to a first embodiment of the present invention.

FIG. 3 shows a schematic diagram of a PLL according to a first embodiment of the present invention. A PLL 30 comprises two phase detectors 31A and 31B, a charge pump 32, an active filter 33 consisted of a resistor R, a capacitor C and an operational amplifier 33A, a VCO 34, a frequency divider 35, and a DAC 36.

As shown in FIG. 3, the active filter 33 comprises a first input connected to the charge pump 32, a second input connected to the DAC 36, and an output for providing a control signal. The capacitor C and the resistor R are connected in parallel between the first input and the output. The VCO 34 generates an oscillation signal according to the control signal. The frequency divider 35 frequency divides the oscillation signal to generate a feedback signal. In the other words, the feedback signal associating with the oscillation signal. According to a reference signal inputted to the PLL 30 and the feedback signal, the first phase detector 31A generates a phase difference signal. The charge pump 32 provides a charge current to the first input of the active filter 33 according to the phase difference signal.

The second phase detector 31B detects a positive/negative sign of the phase difference between the reference signal and the feedback signal, and outputs a digital reference signal. For example, the digital reference signal is an 8-bit binary signal generated by a digital accumulator (not shown) fed with differently valued multi-segment digital unit values. The positive/negative sign of the phase difference determines a positive/negative sign of the input signal to the accumulator, and a change in a speed of output values from the accumulator is dependent on the magnitude of the input signal to the accumulator. For example, when the phase of the reference signal is ahead of that of the feedback signal, the sign of the input signal to the accumulator is positive; conversely, when the phase of the reference signal is behind that of the feedback signal, the sign of the input signal to the accumulator is negative. The DAC 36 then converts the digital reference signal, e.g., a digital reference voltage, to an analog reference voltage, and provides the analog reference voltage to the second input of the active filter 33.

Figure 1:
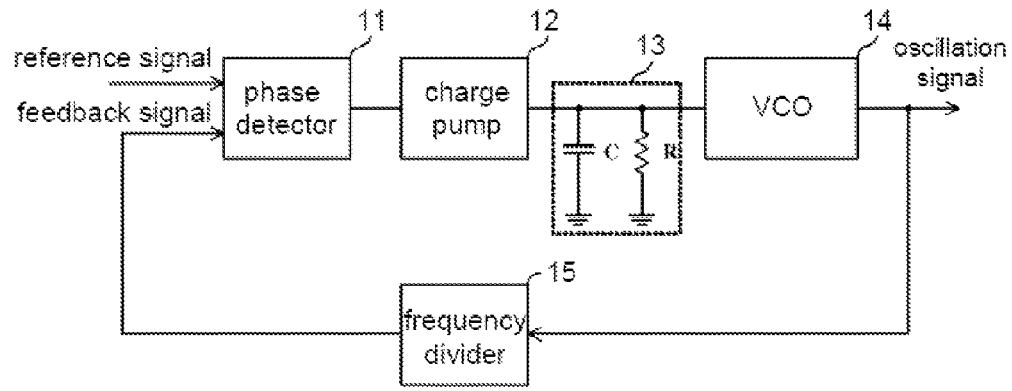
FIG. 1 is a structural diagram of a conventional type-I PLL.
Figure 2:
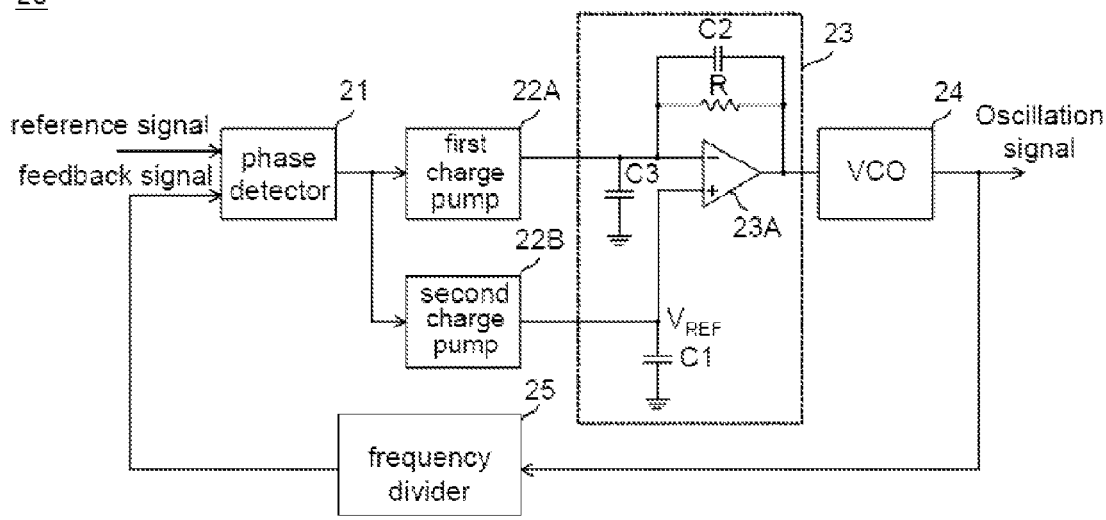
FIG. 2 is a structural diagram of a conventional type-II PLL.
Figure 4:
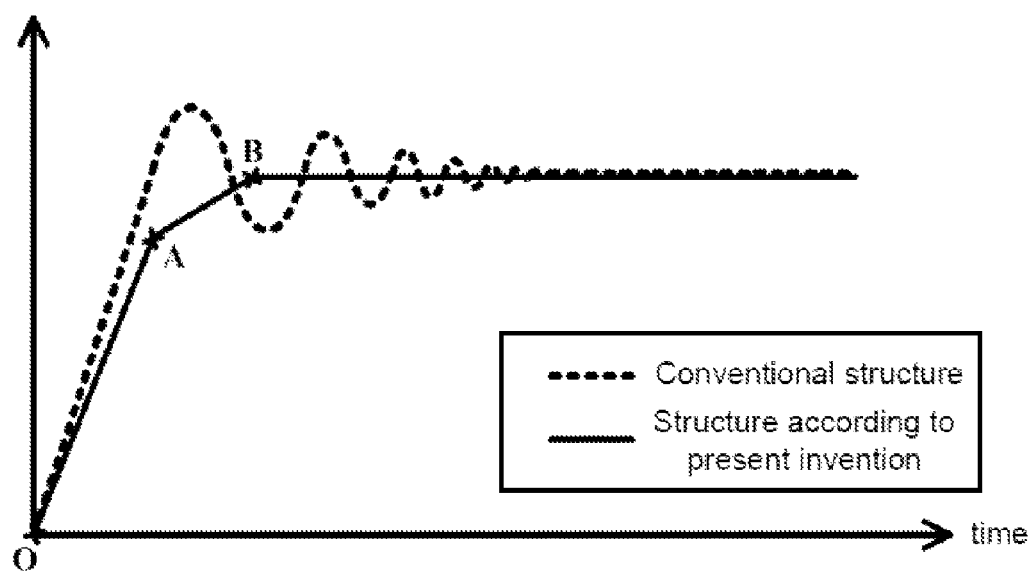
FIG. 4 is an example illustrating a comparison between voltages during a locking process of the present invention and the prior art.

Different from the type-II PLL, before the PLL 30 is locked, a digital charging path formed by the second phase detector 31B and the DAC 36 can be designed to directly provide a predetermined charge amount according to the positive/negative signal and magnitude of the phase difference. FIG. 4 shows an example illustrating a comparison between voltages during a locking process of the present invention and the prior art, where the horizontal axis represents time and the vertical axis represents a voltage value at the output of the active filter 33 (i.e., the control voltage provided to the VCO 34). As observed from FIG. 4, the voltage value undergoes a period of damping before being stabilized when the conventional structure in FIG. 2 is implemented. In contrast, by implementing the structure of the present invention, the analog reference voltage provided by the DAC 36 quickly approximates a predetermined steady value, such that the voltage at the output of the active filter 33 is quickly stabilized.

For example, within a segment O-A in FIG. 4, the input to the accumulator is set to a predetermined high unit value by the second phase detector 31B so that the voltage at the output of the active filter 33 is quickly pulled up. After a predetermined period, the input to the accumulator is modified to another predetermined medium unit value so that the voltage at the output of the active filter 33 slowly increases with a moderate slope to gradually approximate a locked state. Therefore, it is easily appreciated from FIG. 4 that the PLL 30 according to the embodiment of the invention becomes locked faster than the solution associated with the prior art. In other words, by appropriately controlling the reference voltage provided to the active filter 33, the time that the PLL 30 requires for becoming locked is effectively reduced by preventing damping. Depending on actual practice, the default output value of the accumulator may be programmable, such as set to ½ of the power supply voltage VDD of the PLL or any other default values through design. Supposing the voltage at the output of the active filter 33 stabilizes to a target voltage value from VDD/2, the time required for locking is even reduced further since a voltage difference is decreased.

Figure 5:
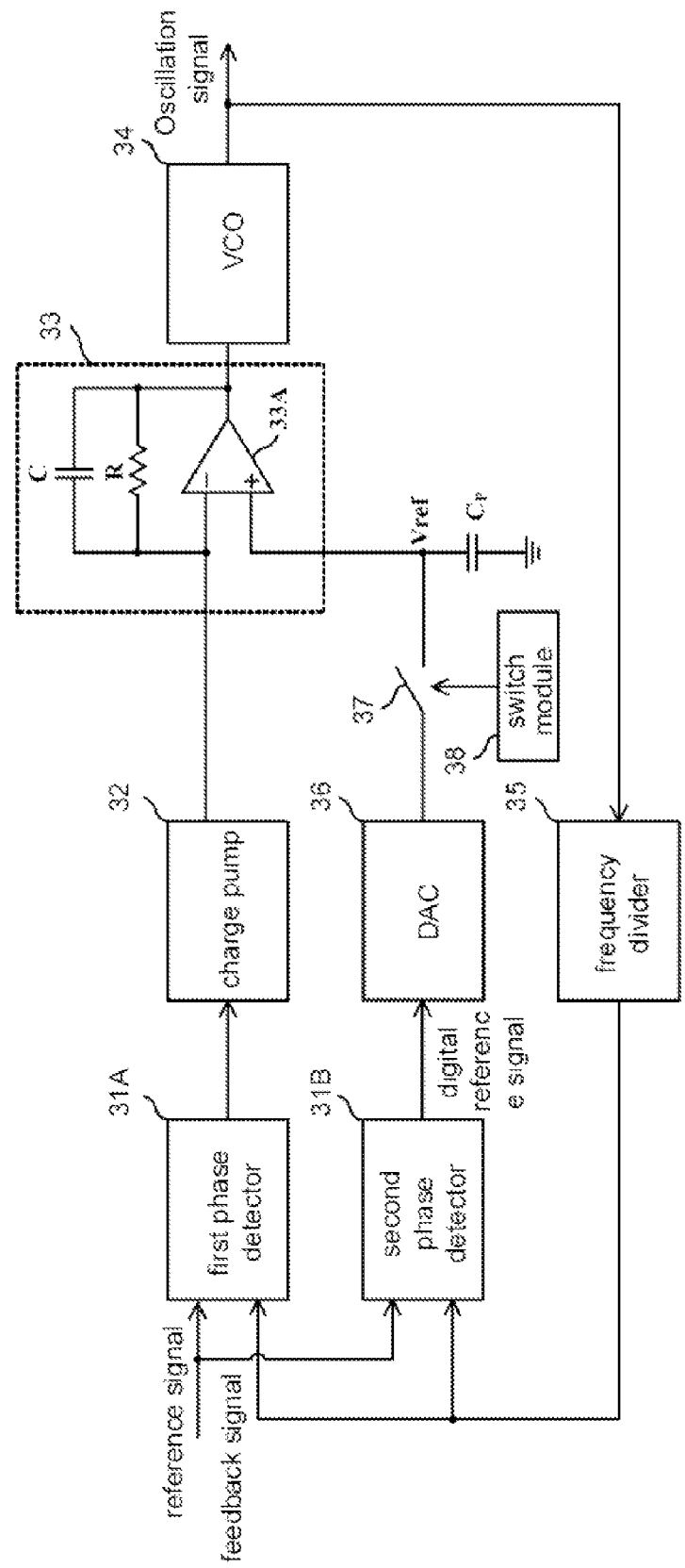
FIG. 5 is a block diagram of a PLL according to a second embodiment of the present invention.

FIG. 5 shows a block diagram according to a second embodiment of the present invention. Compared to first embodiment shown in FIG. 3, the PLL 30 in the second embodiment further comprises a capacitor $C_P$, a switch 37 and a switch module 38 in replacement of the above accumulator. The capacitor $C_P$ is coupled between the active filter 33 and the second input, and the switch 37 is coupled between the second input and the DAC 36. When the PLL 30 enters from an acquisition mode to a tracking mode, the switch module 38 controls the switch 37 to disconnect a link between the DAC 36 and the second input.

When the switch 37 is open to couple the DAC 36 and the second input, operations of the PLL 30 are in large similar to those of the one shown in FIG. 3, and the PLL 30 is equivalent to the type-II PLL shown in FIG. 2. When the switch 37 is controlled to open to disrupt the link between the DAC 36 and the second input, in equivalence, the charge stored in the capacitor $C_P$ continues to provide the reference voltage needed by the active filter 33. When the link is disrupted, operations of the PLL 30 are equivalent to those of the type-I PLL.

The PLL in FIG. 5 contributes two major advantages. Compared to the conventional type-I PLL, the reference voltage needed by the filter is provided via the digital charging path when the PLL in FIG. 5 is under an acquisition mode, so that the time required for locking the PLL 30 is effectively shortened by preventing damping. The other advantage is that the PLL in FIG. 5 under a tracking mode operates as the type-I mode PLL, so that locking the control voltage of the VCO 34 is achieved without having to implement a high precision DAC 36 having a smallest bit count.

Figure 6A:
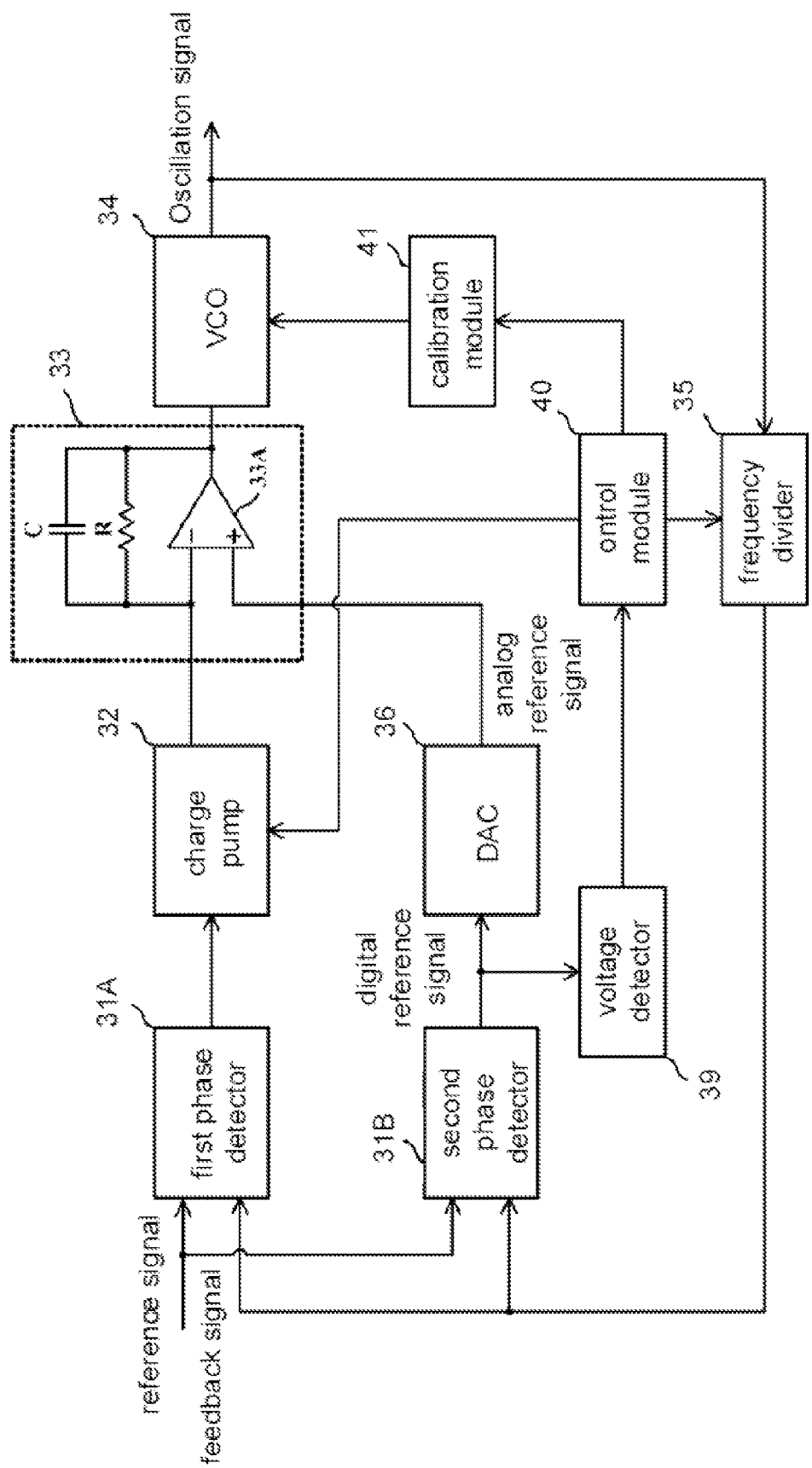
FIG. 6A is a block diagram of a PLL according to a third embodiment of the present invention.

A PLL having a calibration function is disclosed according to a third embodiment of the present invention. With reference to FIG. 6A, apart from the elements shown in FIG. 3, the PLL according to this embodiment further comprises a voltage detector 39, a control module 40 and a calibration module 41. In this embodiment, the charge pump 32 is designed as being capable of selectively providing a predetermined current $I_{norm}$ or a test current $I_{test}$, and the frequency divider 35 is designed as being capable of selectively providing a predetermined frequency dividing amount $N_{norm}$ or a predetermined test frequency dividing amount $N_{test}$. For example, the predetermined current $I_{norm}$ and the predetermined frequency dividing amount $N_{norm}$ are a current amount and a frequency dividing amount provided to the PLL during normal operations.

When the predetermined current amount $I_{norm}$ and the predetermined frequency dividing amount $N_{norm}$ are provided, a loop gain $G_{loop}$ of the PLL is represented as:

$$G_{loop} = \frac{I_{norm} \times R \times K_{VCO}}{N_{norm}} \qquad \text{Formula (1)}$$

Wherein, R represents a resistance value in the active filter 33, $K_{VCO}$ represents a voltage-frequency conversion coefficient of the VCO 34. R and $K_{VCO}$ are usually shifted by a certain degree due to ambient variants from manufacture, temperature to voltage factors, such that many characteristics (e.g., bandwidth) do not match with predetermined ideal values originally hoped to achieve at the time of designing the PLL. The calibration function of the invention is thus targeted at determining a shifted amount of the loop gain $G_{loop}$, based on which the PLL or other peripheral circuits associated with the PLL are calibrated.

To determine the shifted amount of the loop gain $G_{loop}$, the control module 40 first controls the charge pump 32 to provide the predetermined current amount $I_{norm}$ and the frequency divider 35 to provide the predetermined frequency dividing amount $N_{norm}$. When the PLL is locked, the voltage detector 39 measures a voltage associated with the output frequency of the oscillation signal to generate a first reference voltage $V_1$. In this embodiment, the value measured by voltage detector 39 is voltage of the digital reference signal provided by the second phase detector 31B. In practice, the measured value by the voltage detector 39 can also be the analog reference voltage outputted by the DAC 36, or the control voltage provided by the active filter 33 to the VCO 34. Compared to measuring an analog voltage, measuring a digital voltage is relatively convenient and fast.

The control module 40 then controls the charge pump 32 to provide the test current amount $I_{test}$ and controls the frequency divider 35 to continue in providing the predetermined frequency dividing amount $N_{norm}$. When the PLL is almost locked, the voltage detector 39 again measures the digital reference signal to generate a second reference voltage $V_2$. Since the test current amount $I_{test}$ is different from the predetermined current amount $I_{norm}$, the second reference voltage $V_2$ is accordingly different from the previously obtained first reference voltage $V_1$ such that the frequency of the oscillation signal outputted from the VCO 34 is changed. Compared to the frequency of the oscillation signal when the digital reference signal is the first reference voltage $V_1$, the frequency difference $\Delta f_1$ resulted by such condition is represented as:

$$\Delta f_1 = \Delta V_1 \times K_{VCO} = \Delta I \times R \times K_{VCO} \qquad \text{Formula (2)}$$

Wherein, $\Delta I$ represents a difference between the predetermined current amount $I_{norm}$ and the test current amount $I_{test}$, and $\Delta V_1$ represents a difference between the first reference voltage $V_1$ and the second reference voltage $V_2$.

In the next step, the control module 40 controls the charge pump 32 to provide the predetermined current amount $I_{norm}$ and the frequency divider 35 to provide the test frequency dividing amount $N_{test}$. When the PLL is almost locked, the voltage detector 39 again measures the digital reference signal to generate a third reference voltage $V_3$. Since the test frequency dividing amount $N_{test}$ is different from the predetermined frequency dividing amount $N_{norm}$, the third reference voltage $V_3$ is accordingly different from the previously obtained first reference voltage $V_1$ such that the frequency of the oscillation signal outputted from the VCO 34 is changed. Compared to the frequency of the oscillation signal when the digital reference signal is the first reference voltage $V_1$, the frequency difference $\Delta f_2$ resulted by such condition is represented as:

$$\Delta f_2 = \Delta V_2 \times K_{VCO} = \Delta N \times F_{ref} \qquad \text{Formula (3)}$$

Wherein, $\Delta N$ represents a difference between the predetermined frequency dividing amount $N_{norm}$ and the test frequency dividing amount $N_{test}$, $\Delta V_2$ represents a difference between the first reference voltage $V_1$ and the third reference voltage $V_3$, and $F_{ref}$ represents a reference frequency (i.e., a frequency of the reference signal inputted to the PLL).

By dividing Formula (2) by Formula (3):

$$\frac{\Delta f_1}{\Delta f_2} = \frac{\Delta V_1}{\Delta V_2} = \frac{\Delta I \times R \times K_{VCO}}{\Delta N \times F_{ref}} \qquad \text{Formula (4)}$$

From Formula (4), it is derived that:

$$R \times K_{VCO} = \frac{\Delta N}{\Delta I} \times \frac{\Delta V_1}{\Delta V_2} \times F_{ref} \qquad \text{Formula (5)}$$

By combining Formulae (5) and (1), the loop gain $G_{loop}$ of the PLL is represented as:

$$G_{loop} = \frac{I_{norm}}{N_{norm}} \times R \times K_{VCO} = \frac{I_{norm}}{N_{norm}} \times \frac{\Delta N}{\Delta I} \times \frac{\Delta V_1}{\Delta V_2} \times F_{ref} \qquad \text{Formula (6)}$$

It is observed from Formula (6) that, even with shift amounts of R and $K_{VCO}$ being unknown values, the control module 40 is still able to estimate the loop gain $G_{loop}$ of the PLL according to the predetermined current amount $I_{norm}$, the predetermined frequency dividing amount $N_{norm}$, the test current amount $I_{test}$, the test frequency dividing amount $N_{test}$, the first reference voltage $V_1$, the second reference voltage $V_2$, the third reference voltage $V_3$, and the reference frequency $F_{ref}$. Further, the control module 40 is capable of determining a difference between the current loop gain $G_{loop}$ and the ideal loop gain $G_{loop}$ originally designed (i.e., the loop gain $G_{loop}$ when R and $K_{VCO}$ are not shifted).

The calibration module 41 calibrates the PLL according to the loop gain $G_{loop}$ estimated by the control module 40. In this embodiment, the calibration module 41 calibrates the VCO 34 according to the difference between the above loop gain $G_{loop}$ and the ideal value. In practice, the calibration may also calibrate a filter element (e.g., the resistor R or the capacitor C) in the active filter 33.

Figure 6B:
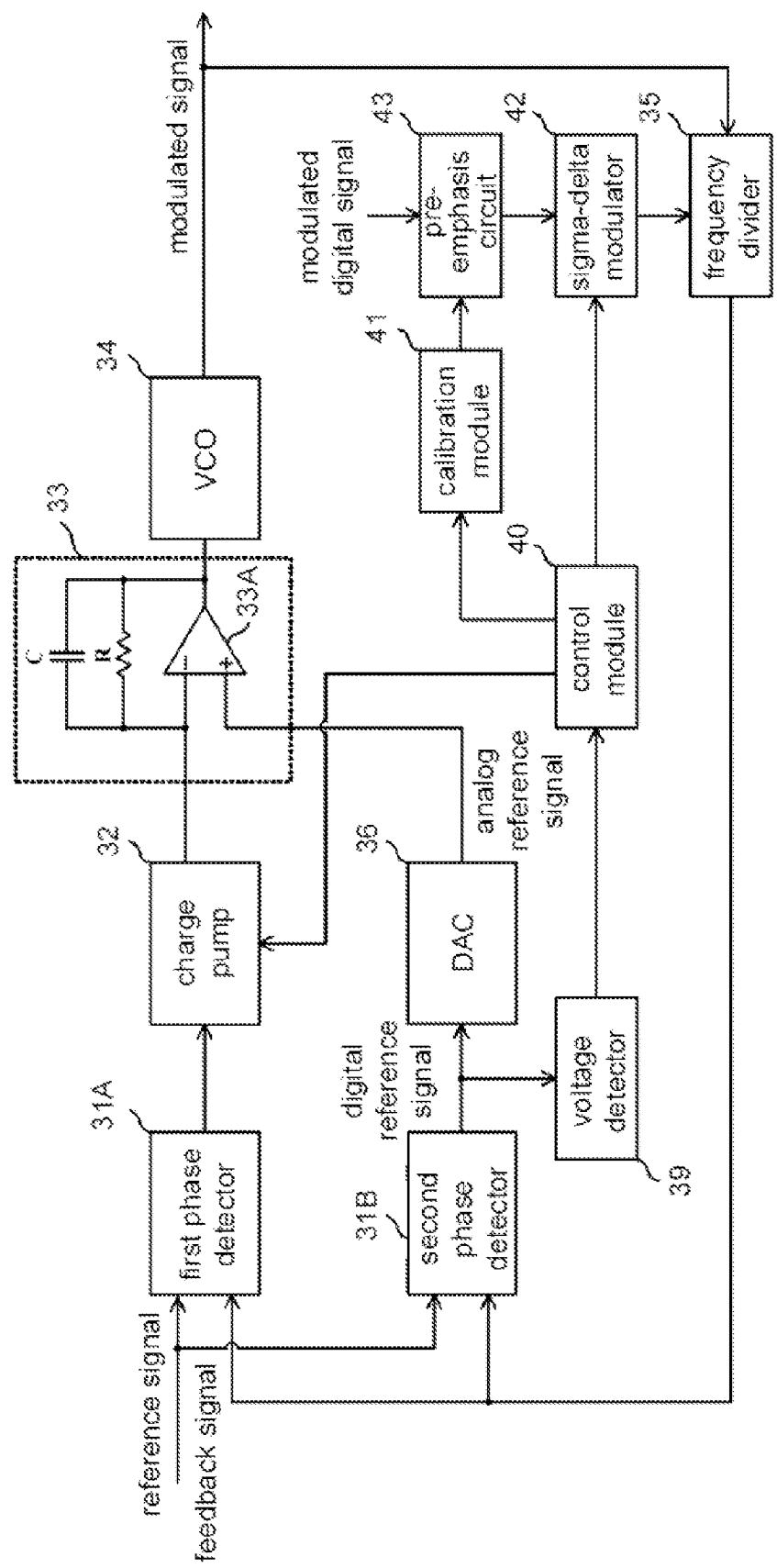
FIG. 6B is a block diagram of a PLL according to a fourth embodiment of the present invention.

FIG. 6B shows a block diagram of a PLL according to a fourth embodiment of the present invention. A main difference between this embodiment and the third embodiment is that, in this embodiment, between the control module 40 and the frequency divider is connected with a sigma-delta ($\Sigma\Delta$) modulator 42 for modulating the test frequency amount so that the frequency amount difference $\Delta N$ can be a non-integer. Further, when the PLL is applied to a digital modulation transmitter, the calibration module 41 may be targeted to modulate a pre-emphasis circuit 43. The pre-emphasis circuit 43 is for providing a high-pass filter effect to compensate attenuation in modulated signals resulted from low-pass filter characteristics of the PLL.

In practice, the design of the pre-emphasis circuit 43 is associated with the loop gain $G_{loop}$. Therefore, when the loop gain $G_{loop}$ is shifted, it is possible that parameters in the pre-emphasis circuit 43 be correspondingly adjusted. The calibration module 41 is this embodiment also calibrates the pre-emphasis circuit 43 according to the loop gain $G_{loop}$ estimated by the control module 40. It is to be understood that the loop gain $G_{loop}$ estimated by the control module 40 can also be applied to peripheral circuits of the PLL instead of being limited to applications of main functional blocks of the PLL.

Further, the calibration method described above may be applied to various circuits of charge pumps and frequency dividers, and are not limited by the examples illustrated by FIGS. 6A and 6B.

Figure 7:
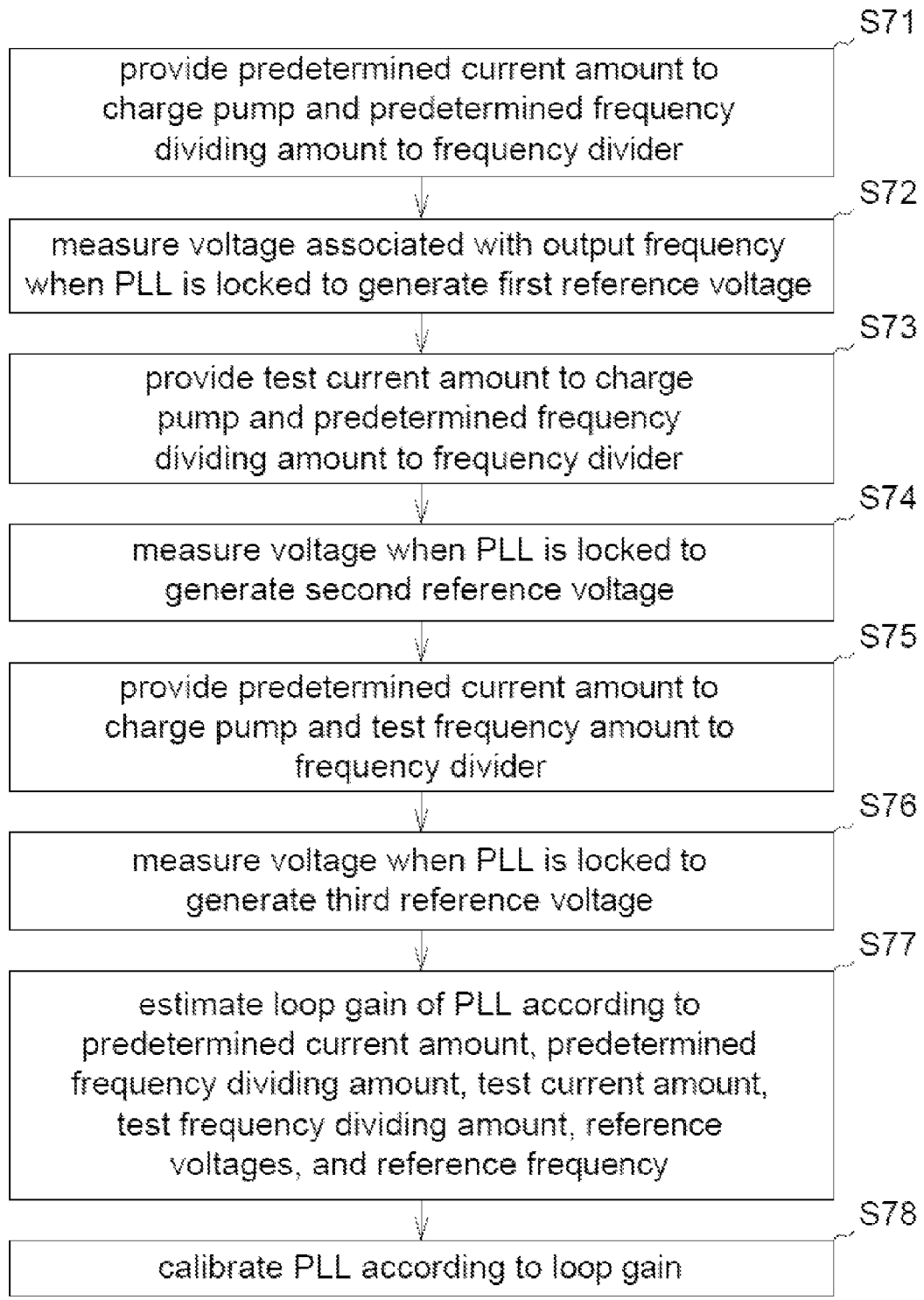
FIG. 7 is a flowchart of a calibration method for a PLL according to a fifth embodiment of the present invention.

A calibration method for a PLL is provided according to a fifth embodiment of the present invention. The PLL comprises a charge pump and a frequency divider. The calibration method comprises steps shown in FIG. 7. In Step S71, a predetermined current amount $I_{norm}$ is provided at the charge pump, and a predetermined frequency dividing a $N_{norm}$ is provided at the frequency divider. In Step S72, when the PLL is locked, a voltage associated with an output frequency of the PLL is measured to generate a first reference voltage $V_1$. In Step S73, a test current amount $I_{test}$ is provided at the charge pump, and the predetermined frequency dividing amount $N_{norm}$ is provided at the frequency divider. In Step S74, when the PLL is locked, the voltage is again measured to generate a second reference voltage $V_2$.

In Step S75, the predetermined current amount $I_{norm}$ provided at the charge pump, and a test frequency dividing amount $N_{test}$ is provided at the frequency divider, wherein the test frequency dividing amount $N_{test}$ is a predetermined value. In Step S76, when the PLL is locked, the voltage is again measured to generate a third reference voltage $V_3$. In Step S77, a loop gain $G_{loop}$ of the PLL is estimated according to the predetermined current amount $I_{norm}$, the predetermined frequency dividing amount $N_{norm}$, the test current amount $I_{test}$, the test frequency dividing amount $N_{test}$, the first reference voltage $V_1$, the second reference voltage $V_2$, the third reference voltage $V_3$, and a reference frequency $F_{ref}$. In Step S78, the PLL is calibrated according to the loop gain $G_{loop}$.

Details of estimation of the loop gain $G_{loop}$ and calibration of the PLL are same as those described in the previous embodiment, and shall be omitted for brevity. It is to be noted that, Steps S73 to S74 and Steps S75 to S76 may be exchanged; further, the calibration method may be applied to PLLs of different structures rather than the examples shown in FIGS. 6A and 6B.

With the embodiments, it is easily appreciated that the PLL of the present invention replaces an analog charging path consisted of a charge pump and a capacitor in the prior art with a digital charging path. The digital charging path of the present invention may be designed to directly provide a predetermined charge amount according to a positive/negative signal of a phase difference, so as to steadily pull-up a reference voltage provided to an active filter and to effectively reduce time needed for locking the PLL by preventing damping. Compared to the prior art, the present invention contributes advantages of having a fast locking speed and low surge energy.

While the invention has been described by way of example and in terms of the preferred embodiment(s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A phase-locked loop (PLL), comprising:
   an active filter, comprising a first input, a second input, and an output for providing a control signal;
   a voltage-controlled oscillator (VCO) that generates an oscillation signal according to the control signal;
   a first phase detector that generates a phase difference signal according to a reference signal and a feedback signal, the feedback signal associated with the oscillation signal;
   a charge pump that provides a charging current to the first input of the active filter according to the phase difference signal;
   a second phase detector that generates a digital reference signal according to a phase difference between the reference signal and the feedback signal, the second phase detector generating the digital reference signal with differently valued multi-segment digital unit values as input; and
   a digital-to-analog converter (DAC) that converts the digital reference signal to an analog reference signal which is fed to the active filter.

2. The PLL according to claim 1, further comprising:
   a capacitor, coupled to the second input of the active filter;
   a switch, coupled between the second input and the DAC; and
   a switch module that controls the switch to disconnect a link between the DAC and the second input.

3. The PLL according to claim 1, wherein the digital reference signal is fixed at a predetermined voltage when the phase difference is greater than a threshold.

4. The PLL according to claim 1, wherein the active filter comprises an operational amplifier, a capacitor, and a resistor, wherein two inputs of the operational amplifier are respectively the first input and the second input, and wherein the capacitor and the resistor are connected in parallel between the first input and the output.

5. The PLL according to claim 1, wherein the second phase detector comprises an accumulator that generates the digital reference signal, and wherein a positive/negative signal of the phase difference corresponds to a positive/negative signal of an input signal of the accumulator.

6. The PLL according to claim 5, wherein a change in a speed of the digital reference signal corresponds to a magnitude of the input signal of the accumulator.

7. The PLL according to claim 1, further comprising:
   a frequency divider, coupled to the VCO, that frequency-divides the oscillation signal to generate the feedback signal.

8. A method for controlling a phase-locked loop (PLL), comprising:
   providing a control signal by an active filter;
   generating an oscillation signal according to the control signal;
   generating a phase difference signal according to a reference signal and a feedback signal, the feedback signal associated with the oscillation signal;
   providing a charging current to a first input of the active filter according to the phase difference signal;
   generating a digital reference signal with differently valued multi-segment digital unit values as input according to a phase difference between the reference signal and the feedback signal; and
   converting the digital reference signal to an analog reference signal which is fed to the active filter.

9. The method according to claim 8, wherein the digital reference signal is fixed at a predetermined voltage when the phase difference is greater than a threshold.

10. The method according to claim 8, wherein the digital reference signal is generated by an accumulator, and wherein a positive/negative signal of the phase difference corresponds to a positive/negative signal of an input signal of the accumulator.

11. The method according to claim 10, wherein a change in a speed of the digital reference signal corresponds to a magnitude of the input signal of the accumulator.

* * * * *